(12) United States Patent
Ohguro (10) Patent No.: US 6,777,756 B2
(45) Date of Patent: Aug. 17, 2004

(54) SEMICONDUCTOR DEVICE (75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 10/102,631

(22) Filed: Mar. 22, 2002

(65) Prior Publication Data

US 2002/0137298 A1 Sep. 26, 2002

(30) Foreign Application Priority Data

Mar. 26, 2001 (JP) .......................... 2001-087400

(51) Int. Cl.$^7$ .............................. H01L 29/76
(52) U.S. Cl. ................. 257/365; 257/331; 257/365; 257/366; 257/387; 257/388; 257/401; 257/412; 257/413; 257/506; 257/510; 438/284; 438/365
(58) Field of Search ................. 257/331, 365, 257/506, 510, 366, 387, 388, 401, 412, 413; 438/284, 365

(56) References Cited

U.S. PATENT DOCUMENTS

| | | | | |
|---|---|---|---|---|
| 6,281,547 B1 | * | 8/2001 | So et al. ................. | 257/330 |
| 6,316,808 B1 | * | 11/2001 | Smith, III ................. | 257/339 |
| 6,597,043 B1 | * | 7/2003 | Naem ................. | 257/387 |

OTHER PUBLICATIONS

H. Shimomura, et al., "A Mesh–Arrayed MOSFET (MA–MOS) for High–Frequency Analog Applications", Symposium on VLSI Technology Digest of Technical Papers, 1997, 6B–3, pp. 73–74.

Toyoji Yamamoto, et al., "High–Frequency Characteristics and Its Dependence On Parasitic Comopnents in 0.1μm Si–MOSFETs", Symposium on VLSI Techonology Digest of Technical Papers, 1996, 14.3, pp. 136–137.

M. Saito, et al., "Advantage of Small Geometry Silicon MOSFETs for High–Frequency Analog Applications Under Low Power Supply Voltage of 0.5V", Symposium on VLSI Technology Digest of Technical Papers, 1995, 7A–4, pp. 71–72.

* cited by examiner

Primary Examiner—Tom Thomas
Assistant Examiner—Edgardo Ortiz
(74) Attorney, Agent, or Firm—Oblon, Spivak, McClelland, Maier & Neustadt, P.C.

(57) ABSTRACT

An aspect the present invention is to provide a semiconductor device including at least one MISFET structure having an element isolation region formed on a surface portion of a semiconductor substrate to have a closed region, an element region formed on the surface region of the semiconductor substrate to surround the element isolation region, a gate insulating film formed to cover at least the surface of the element region, a contact region formed on the element isolation region, and at least four gate electrodes connected to the contact region and formed on the surface of the element region via the gate insulating film to extend to at least outside the element region.

10 Claims, 7 Drawing Sheets

SEMICONDUCTOR DEVICE

CROSS REFERENCE TO RELATED APPLICATION

This application claims benefit of priority under 35 USC 119 to Japanese Patent Application No. 2001-87400, filed on Mar. 26, 2001, the entire contents of which are incorporated by reference herein.

BACKGROUND OF THE INVENTION

1. Field of the Invention

The present invention relates to a semiconductor device and, more particularly, to a device including a MISFET (Metal Insulator Semiconductor Field Effect Transistor) which is suitable for an analog circuit and whose gate electrodes have a finger structure.

2. Discussion of the Background

In recent years, portable telephones rapidly spread and are widely used. RF circuits used in the portable telephones are changing from circuits using bipolar transistors as a conventional mainstream to circuits using MISFETs due to requirements for cost and size reduction.

Generally, in a MISFET for an analog circuit, a gate length Lg is reduced to increase the current gain and power gain. At this time, in a MISFET structure having one gate electrode, a gate resistance Rg becomes high.

Figure 9:
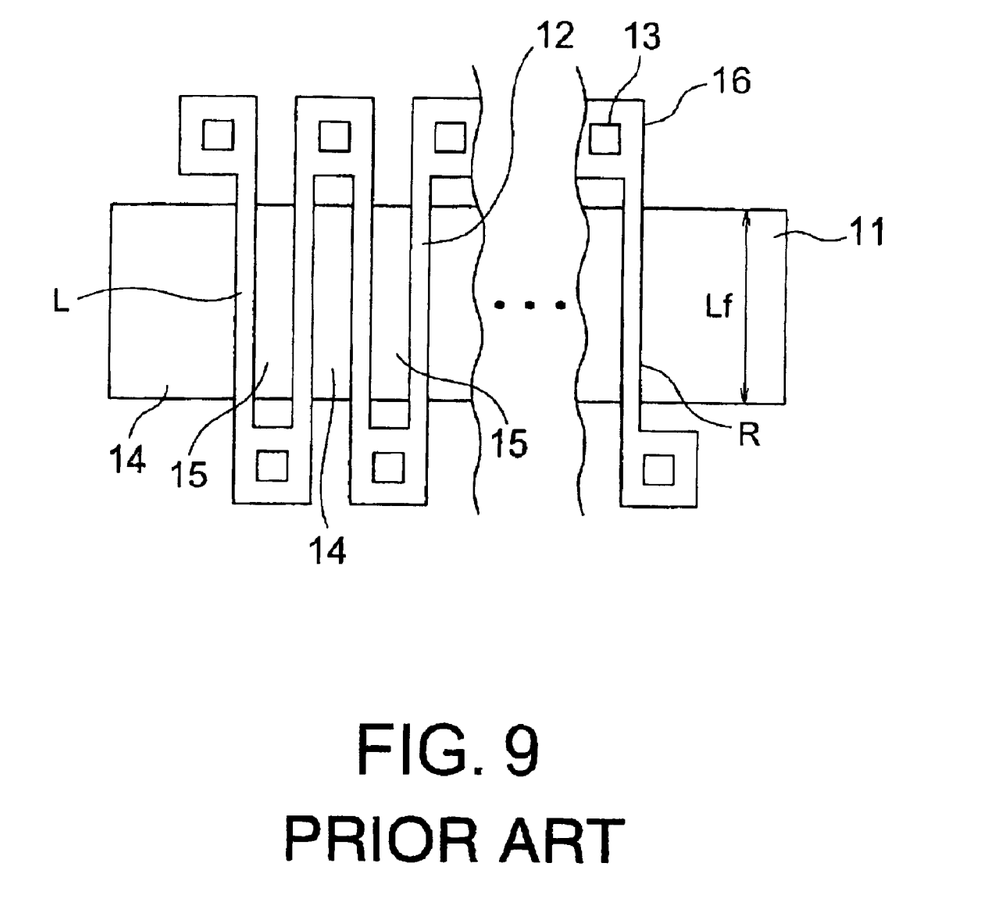
FIG. 9 is a plan view showing the structure of a conventional semiconductor device.

To prevent this, finger-shaped gate electrodes 12 as shown in FIG. 9 are interdigitated. In this structure, an element region 11 surrounded by an element isolation region is formed on the surface of a semiconductor substrate. A plurality of contact regions 16 for connecting a wiring layer (not shown) to the gate electrodes 12 through a dielectric interlayer are arranged outside both sides of the element region 11 along its longitudinal direction.

The plurality of gate electrodes 12 are formed on the surface of the element region 11 via a gate oxide film (not shown). Each gate electrode 12 is connected to a corresponding contact region 16 on both sides of the element region 11. Each contact region 16 has one or more than one contact portions 13, as shown in FIG. 9.

In this case, the gate resistance Rg is given by $$Rg = \rho s * Lf^2 / (Lg * Wg) \quad (1)$$

where $\rho s$ is the sheet resistance, Lf is the length of a finger, Lg is the gate length, and Wg is the gate width=Lf*(number of fingers).

A maximum operation frequency at which an amplified signal is output from the drain, i.e., cutoff frequency fT (frequency when the current gain is unity) is given by $$fT = gm / (2\pi(Cgb + Cgs)) \quad (2)$$

where gm is the transconductance, Cgb is the capacitance between the gate and the element isolation region, and Cgs is the capacitance between the gate and the element region (source, drain, and channel regions).

A maximum oscillation frequency fmax (frequency when the power gain is unity) is given by $$fmax = (fT/2) * (Rout/(Rg + Rch))^{1/2} \quad (3)$$

where Rout is the output resistance, and Rch is the ON resistance.

As is apparent for equations (1) to (3), when the gate resistance Rg increases, the maximum oscillation frequency fmax decreases. As a result, the power gain degrades.

However, the conventional semiconductor device has two problems.

First, when the number of fingers is increased by shortening the length Lf of one finger to reduce the gate resistance Rg, the total area of the contact regions 16 increases. This increases the capacitance Cgb between the gate electrodes 12 and the element isolation region. As a result, as is apparent from equations (2) and (3), the cutoff frequency fT and maximum oscillation frequency fmax decrease. Consequently, the current gain and power gain decrease to degrade the frequency characteristic.

When the plurality of gate electrodes 12 are arranged, as shown in FIG. 9, the widths (thicknesses) of all the gate electrodes 12 can hardly be uniformed.

Due to the optical influence in the lithography process, only gate electrodes L and R on the outer sides have smaller widths than those of the remaining gate electrodes 12. Hence, if the pattern becomes small, and the pitch between the gate electrodes 12 decreases, the widths of the outer gate electrodes L and R become too small. This may cause punch-through.

Figure 10:
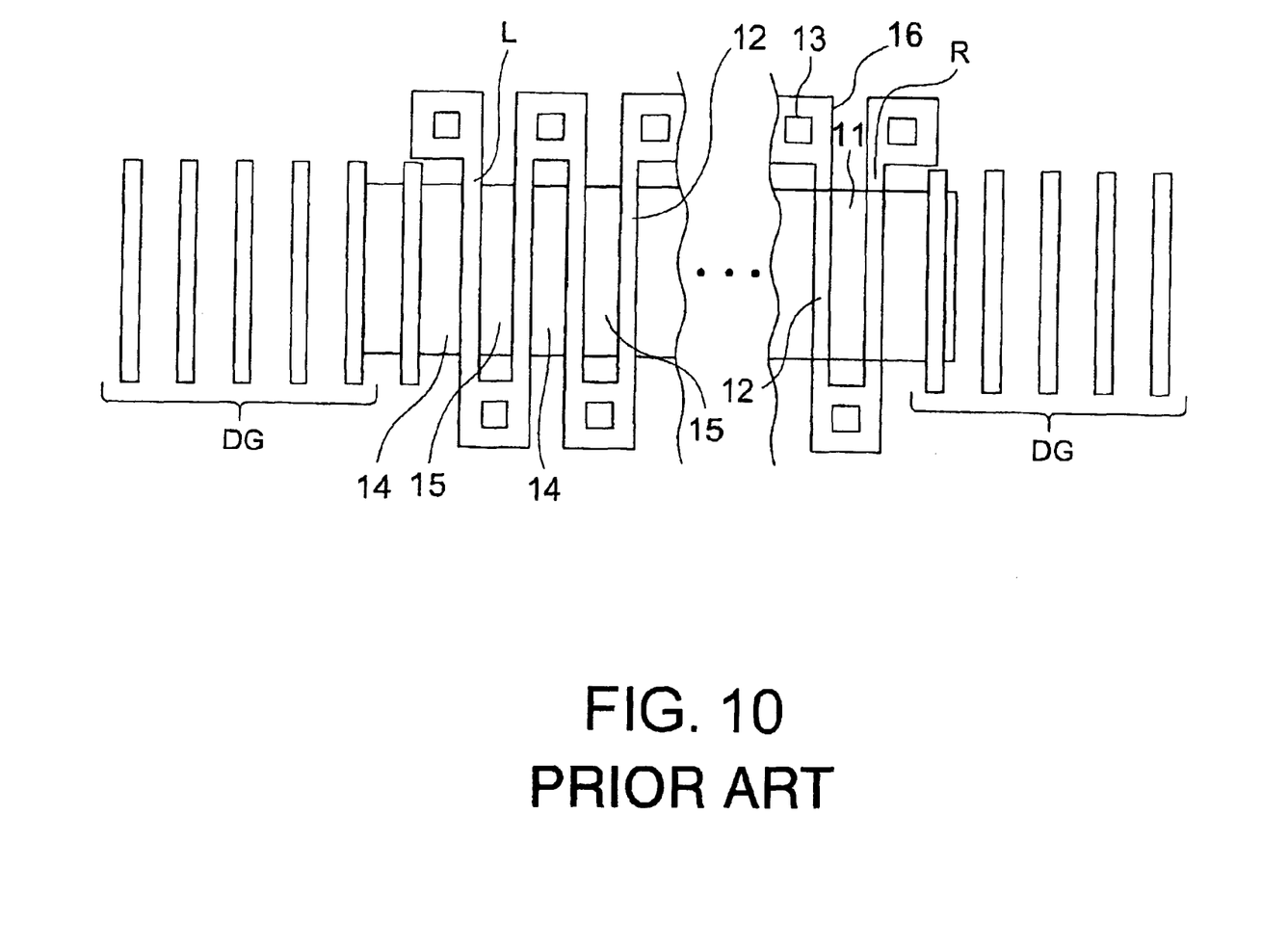
FIG. 10 is a plan view showing the structure of another conventional semiconductor device.

To solve these problems, dummy gates DG are formed on the outer sides of the outer gate electrodes L and R, as shown in FIG. 10. The same optical influence as that for the remaining gate electrodes 12 is obtained, thereby solving that problem.

However, no effect can be obtained by arranging only one dummy gate DG adjacent to each of the gate electrodes L and R. A plurality of dummy gates, e.g., five or more dummy gates are necessary, as shown in FIG. 9. For this reason, the element region increases due to the dummy gates DG, resulting in an increase in chip size.

As described above, in the conventional devices shown in FIGS. 9 and 10, if the number of fingers is increased to reduce the gate resistance, the area of the contact regions increases. This increases the capacitance between the gate and the element isolation region to degrade the RF characteristic. In addition, the gate electrodes in the finger structure cannot be formed to a uniform width without increasing the element area.

SUMMARY OF THE INVENTION

A semiconductor device according to an aspect of the present invention comprises at least one MISFET structure, the MISFET structure comprising an element isolation region formed on a surface portion of a semiconductor substrate to have a closed region, an element region formed on the surface region of the semiconductor substrate to surround the element isolation region, a gate insulating film formed to cover at least a surface of the element region, a contact region formed on the element isolation region, and at least four gate electrodes connected to the contact region and formed on the surface of the element region via the gate insulating film to extend to at least outside the element region.

DESCRIPTION OF THE EMBODIMENTS

The embodiments of the present invention will be described below with reference to the accompanying drawings.

(1) First Embodiment

Figure 1A:
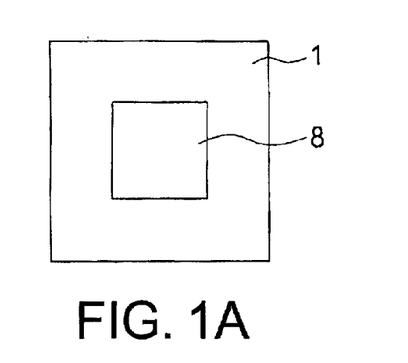
FIGS. 1A to 1C are plan views showing the structure of a semiconductor device according to the first embodiment of the present invention.
Figure 1B:
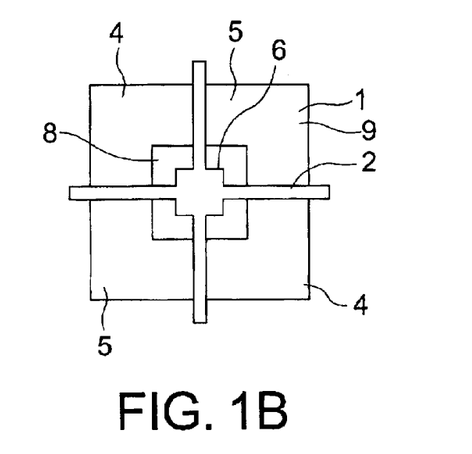
Figure 1C:
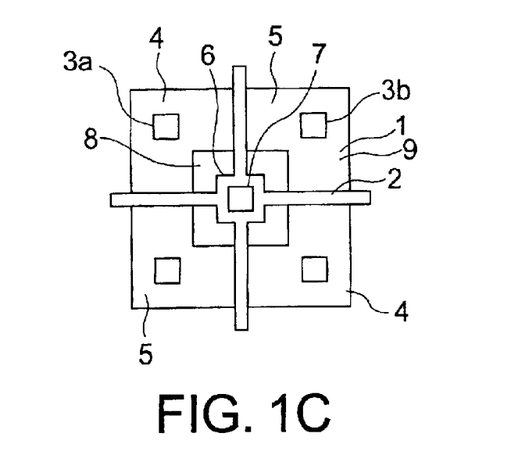

A semiconductor device according to the first embodiment has a structure shown in FIGS. 1A to 1C. As shown in FIG. 1A, on the surface portion of a semiconductor substrate, an element isolation region 8 having a closed region and an element region 1 that surrounds the element isolation region are formed. As the pattern of the element region 1, the inner and outer peripheral shapes may be rectangle, as shown in FIG. 1A, or may be polygonal, circular, or elliptical.

As shown in FIG. 1B, a conducive film radially extending outward from almost the center of the element isolation region 8 surrounded by the inner periphery of the element region 1 is patterned to form a plurality (even number ≧4) of gate electrodes 2 via a gate insulating film 9 formed on the surface of the element region 1.

In the element region 1 partitioned by the gate electrodes 2, an impurity is ion-implanted and diffused using the gate electrodes 2 as a mask to alternately form source regions 4 and drain regions 5. When the number of fingers of the gate electrodes 2 is even, the source regions 4 and drain regions 5 can be alternately formed.

A dielectric interlayer (not shown) is formed to cover the surfaces of the element region 1, element isolation region 8, and gate electrodes 2 shown in FIG. 1B. As shown in FIG. 1C, contact holes are formed in the dielectric interlayer to expose contact portions 7, 3a, and 3b on the surfaces of a contact region 6, source regions 4, and drain regions 5.

After that, as in a normal wiring process, a conductive film is deposited on the dielectric interlayer to fill the contact holes and patterned to form a wiring layer. The wiring layer is electrically connected to the gate electrodes 2, source regions 4, and drain regions 5 through the contact portions 7, 3a, and 3b, respectively.

In the above-described conventional semiconductor devices shown in FIGS. 9 and 10, one gate electrode 12 is connected to one contact region 16. To the contrary, according to this embodiment, four gate electrodes 2 are connected to one contact region 6. For this reason, as compared to the device shown in FIG. 9, a capacitance Cgb between the gate and the substrate can be reduced to ¼ by distributing it to the four gate electrodes 2 in realizing the same gate width sum Wg. Hence, the RF characteristic is improved.

In addition, the respective gate electrodes 2 are well-symmetrized. This structure solves the problem described with reference to FIG. 10 that the gate electrodes L and R at the two ends are formed thinner than the remaining gate electrodes 12. Since the dummy electrodes which are used to uniform the widths of the gate electrodes, as in the device shown in FIG. 10, need not be formed, any increase in element area can be prevented.

(2) Second Embodiment

Figure 2:
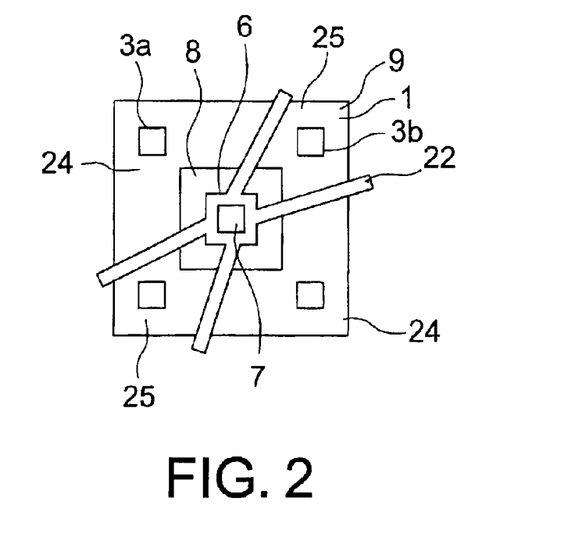
FIG. 2 is a plan view showing the structure of a semiconductor device according to the second embodiment of the present invention.

The second embodiment of the present invention has a structure shown in FIG. 2. In this embodiment, the area of a drain region 25 is smaller than that of a source region 24, unlike the first embodiment shown in FIG. 1C. With this structure, the capacitance between the drain region 25 and the substrate decreases. Since the time required for charge/discharge in outputting a signal from the drain region 25 is shortened, the operation time decreases. The remaining components and effects are the same as in the first embodiment, and a description thereof will be omitted.

(3) Third Embodiment

Figure 3:
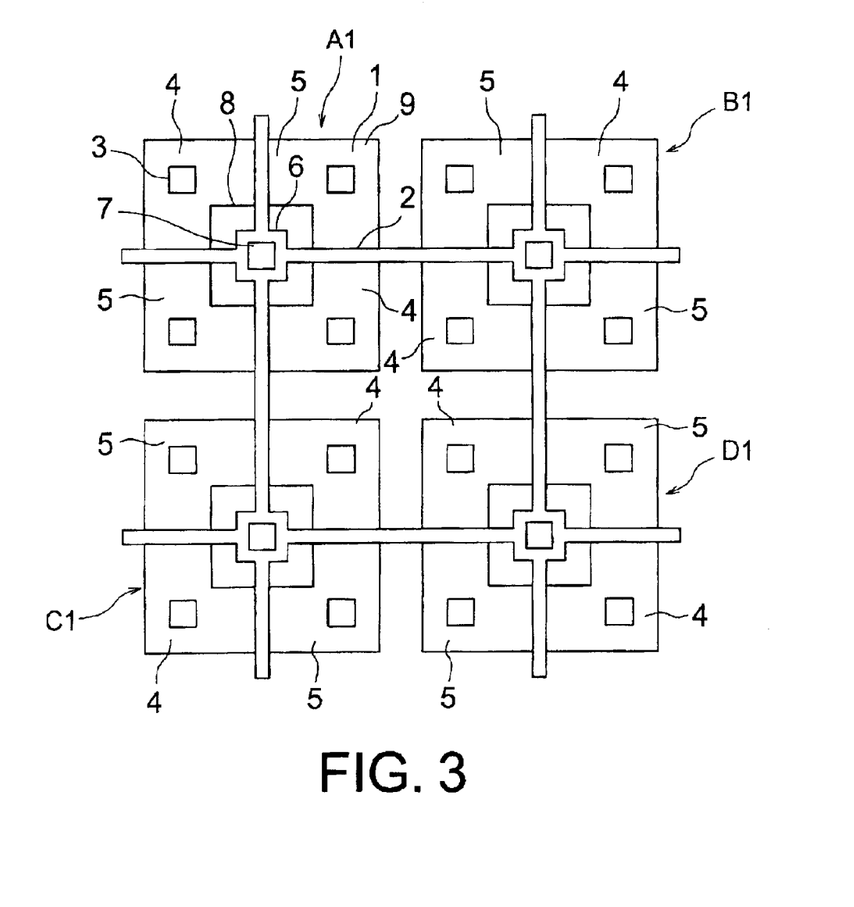
FIG. 3 is a plan view showing the structure of a semiconductor device according to the third embodiment of the present invention.

The third embodiment of the present invention has a structure shown in FIG. 3. This embodiment corresponds to a case wherein a plurality of MISFET structures of the first embodiments shown in FIG. 1C are formed. In FIG. 3, four MISFET structures are formed.

Gate electrodes 2 in four MISFETs A1, B1, C1, and D1 are electrically connected to each other. Source regions 4 and drain regions 5 opposing each other are not connected but separated from each other by element isolation regions formed therebetween. For example, the opposing source regions 4 in the MISFETs A1, B1, C1, and D1 or the opposing drain regions 5 in the MISFETs A1, B1, C1, and D1 are not connected to each other. Instead, the source regions 4 or drain regions 5 are electrically connected to each other by a wiring layer that is in contact with the respective regions through a dielectric interlayer.

According to this embodiment, since four gate electrodes 2 are connected to one contact region 6 in each of the MISFETs A1 to D1, the RF characteristic can be improved by reducing a capacitance Cgb between the gate and the substrate, as in the first embodiment.

In addition, the respective gate electrodes 2 in each of the MISFETs A1 to D1 are well-symmetrized. This structure solves the problem in the conventional devices shown in FIGS. 9 and 10 that the widths of the gate electrodes become nonuniform.

Figure 4:
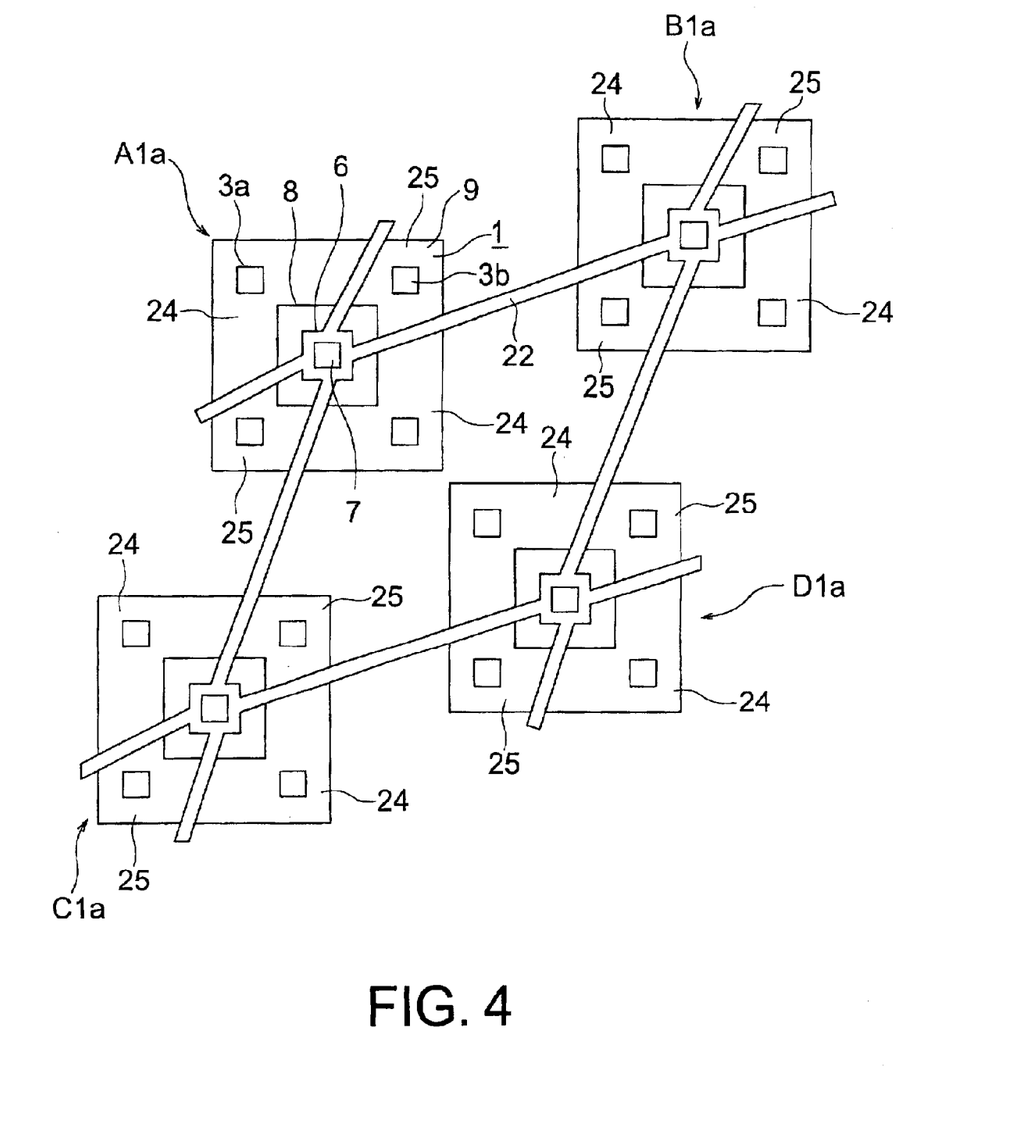
FIG. 4 is a plan view showing the structure of a modification to the third embodiment.

FIG. 4 shows a modification to the third embodiment. In this modification, the second embodiment shown in FIG. 2 is applied to the third embodiment shown in FIG. 3. Unlike the third embodiment, the area of a drain region 25 is smaller than that of a source region 24 in each MISFET structure. With this structure, the capacitance between the drain region 25 and the substrate decreases. Since the time required for charge/discharge in outputting a signal from the drain region 25 is shortened, the operation speed increases. The remaining components and effects are the same as in the second and third embodiments, and a description thereof will be omitted.

(4) Fourth Embodiment

Figure 5:
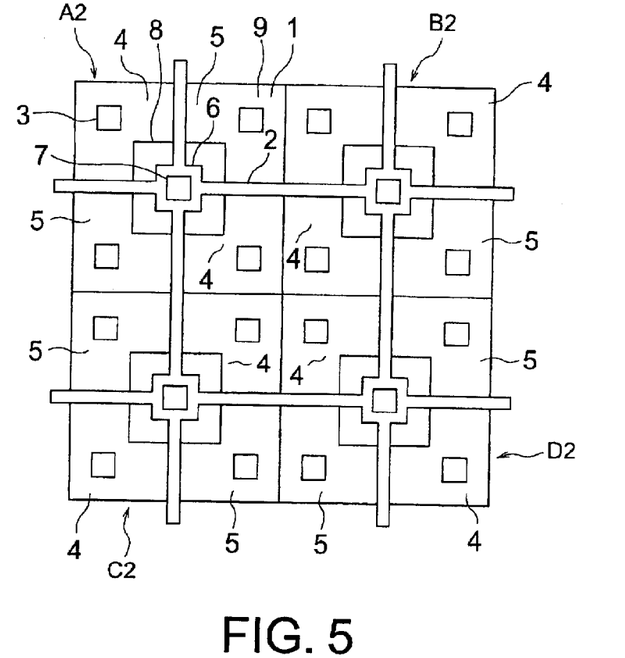
FIG. 5 is a plan view showing the structure of a semiconductor device according to the fourth embodiment of the present invention.

FIG. 5 shows the structure of the fourth embodiment of the present invention. This embodiment corresponds to a case wherein a plurality of MISFET structures of the first embodiments are formed, like the third embodiment.

As in the third embodiment, gate electrodes 2 in four MISFETs A2, B2, C2, and D2 are electrically connected to each other. However, the fourth embodiment is different from the third embodiment in that adjacent source regions 4 and drain regions 5 are connected in the substrate, and no element isolation regions are formed therebetween. For example, the four opposing source regions 4 in the MISFETs A2, B2, C2, and D2, or the two opposing drain regions 5 in the MISFETs A2, B2, C2, and D2 are connected to each other.

Even in this embodiment, the same effects as in the third embodiment, i.e., an improvement of the RF characteristic and the uniform gate electrode width can be realized.

Additionally, according to this embodiment, the sources and drains between the adjacent MISFET structures are directly connected in the substrate, and no element isolation regions need be formed therebetween, unlike the third embodiment. For this reason, the element area can be reduced.

Furthermore, since the source regions or drain regions between the adjacent MISFET structures are connected, no contact portion need be formed for each source region or drain region partitioned by the gate electrodes. Hence, the degree of freedom in layout of contact portions increases. This is also advantageous in further reducing the element area.

Figure 6:
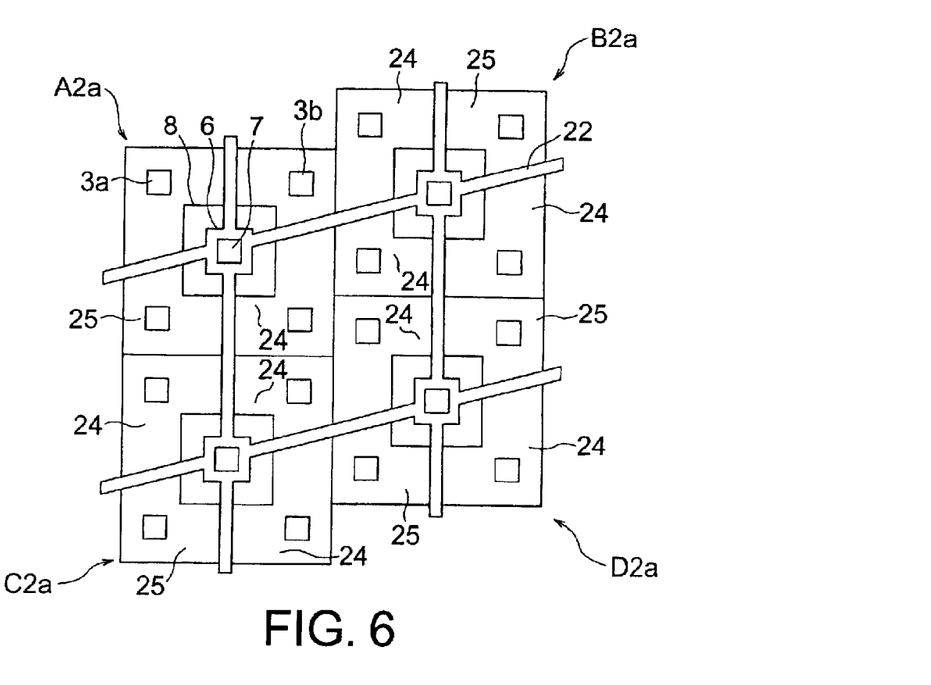
FIG. 6 is a plan view showing the structure of a modification to the fourth embodiment.

FIG. 6 shows a modification to the fourth embodiment. In this modification, the second embodiment shown in FIG. 2 is applied to the fourth embodiment shown in FIG. 5. Unlike the fourth embodiment, the area of a drain region 25 is smaller than that of a source region 24 in each MISFET structure. With this structure, the capacitance between the drain region 25 and the substrate decreases. Since the time required for charge/discharge in outputting a signal from the drain region 25 is shortened, the operation speed increases. The remaining components and effects are the same as in the second and forth embodiments, and a description thereof will be omitted.

(5) Fifth Embodiment

Figure 7:
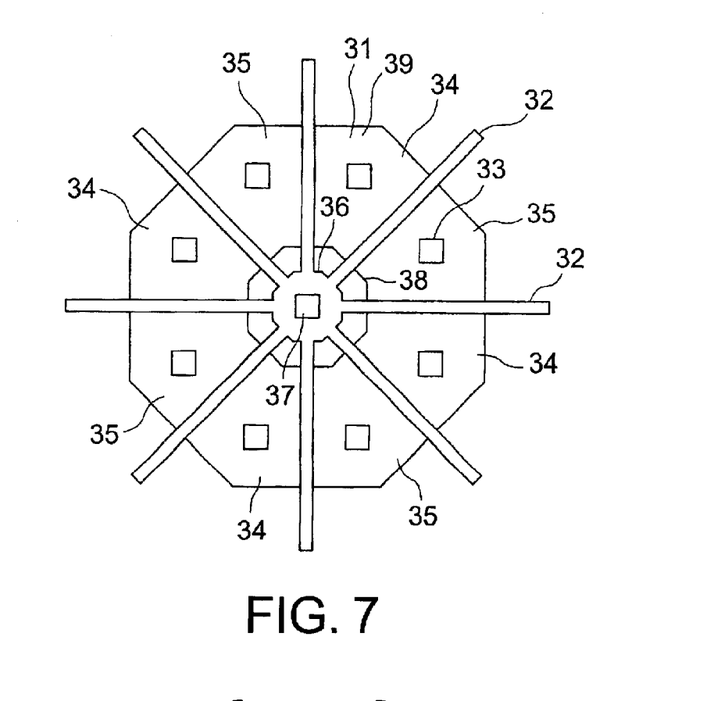
FIG. 7 is a plan view showing the structure of a semiconductor device according to the fifth embodiment of the present invention.

The fifth embodiment of the present invention will be described with reference to FIG. 7. This embodiment has a structure in which eight gate electrodes 32 are connected to one contact region 36. As in the first embodiment, an element isolation region 38 is formed under the contact region 36. An element region 31 is formed around the element isolation region 38. In the element region 31, source regions 34 and drain regions 35 partitioned by the gate electrodes 32 are alternately arranged. Reference numerals 33 and 37 denote contact portions.

According to this embodiment that employs the above structure, since eight gate electrodes 32 are connected to one contact region 36, a capacitance Cgb between the gate and the substrate decreases to 1/8 that of the devices related to the present invention. Hence, the RF characteristic is improved.

In addition, since the respective gate electrodes 32 are well-symmetrized, the gate electrode widths can be uniformed.

The element region 31 has octagonal inner and outer peripheral shapes. However, it may have any other shape such as a polygonal shape with three, four, five or more apexes, or a circular or elliptical shape.

(6) Sixth Embodiment

Figure 8:
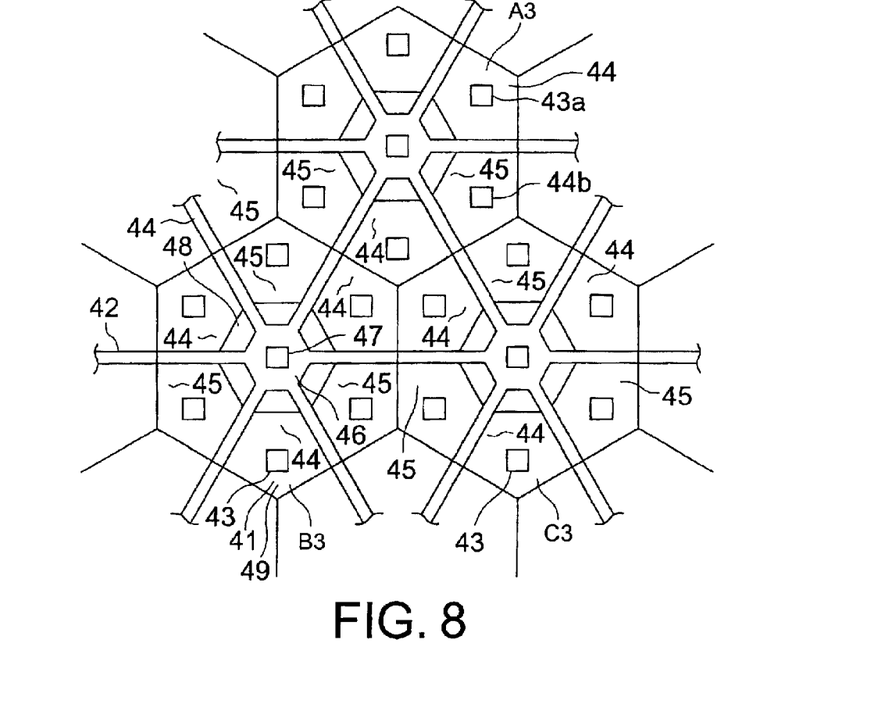
FIG. 8 is a plan view showing the structure of a semiconductor device according to the sixth embodiment of the present invention.

The sixth embodiment of the present invention will be described with reference to FIG. 8. This embodiment has a structure in which a plurality of, e.g., three or more MISFETs A3, B3, C3, . . . are connected without forming any element isolation regions between active regions. Even in the fourth embodiment, the element regions 1 in the plurality of MISFETs A1, B1, C1, D1, . . . are closely laid out. In this case, however, each element region 1 has a rectangular shape, four gate electrodes 2 are connected to one contact region 6, and each element region 1 is divided into a total of four source and drain regions 4 and 5.

In the sixth embodiment, an element region 41 of each of the MISFETs A3, B3, C3, . . . has a hexagonal shape. Six gate electrodes 42 are connected to one contact region 46. Each element region 41 is divided into a total of six source and drain regions 44 and 45. Adjacent source regions 44 or drain regions 45 between the MISFETs A3, B3, C3 . . . are connected. For example, the three opposing source regions 44 between the MISFETs A3, B3, C3 . . . are connected to each other. The drain regions 45 adjacent between the MISFETs A3 and B3, the drain regions 45 adjacent between the MISFETs A3 and C3, or the drain regions 45 adjacent between the MISFETs B3 and C3 are connected to each other. Reference numerals 43 (43a and 43b) and 47 denote contact portions.

Even in this embodiment, the RF characteristic can be improved, the widths of the gate electrodes can be uniformed, and the element area can be reduced by directly connecting the source regions and drain regions between the adjacent MISFET structures, as in the fourth embodiment.

As described above, according to the semiconductor devices of the above embodiments, since four or more gate electrodes are connected to one contact region, the capacitance between the gate and the substrate is distributed by the plurality of gate electrodes, so the RF characteristic is improved. In addition, since the gate electrodes can be well-symmetrized, the problem of nonuniform gate electrode width when a plurality of gate electrodes are interdigitated can be solved.

The above-described embodiments are mere examples, and the present invention is not limited to them. For example, in the embodiments, four, six, or eight gate electrodes are connected to each contact region. However, the number of gate electrodes is not limited to the above examples as long as at least four gate electrodes are connected to each contact region.

What is claimed is:

1. A semiconductor device including at least one MISFET structure, said MISFET structure comprising:

an element isolation region formed on a surface portion of a semiconductor substrate to have a closed region;

an element region formed on the surface region of the semiconductor substrate to surround said element isolation region;

a gate insulating film formed to cover at least a surface of said element region;

a contact region formed on said element isolation region; and at least four gate electrodes connected to said contact region and formed on the surface of said element region via said gate insulating film to extend to at least outside said element region, wherein in said element region, regions partitioned by said gate electrodes are alternately allocated to source regions and drain regions, and an area of at least one of said drain regions is different from that of at least one of said source regions.

2. The device according to claim 1, wherein said device comprises a plurality of MISFET structures, and gate electrodes of said MISFET structures are electrically connected to each other.

3. The device according to claim 1, wherein at least one of said drain regions has an area smaller than that of at least one of said source regions.

4. The device according to claim 1, wherein a total area of said drain regions is smaller than a total area of said source regions.

5. The device according to claim 3, wherein said device comprises a plurality of MISFET structures, and
gate electrodes of said MISFET structures are electrically connected to each other.

6. The device according to claim 5, wherein adjacent source regions between said plurality of MISFET structures, and adjacent drain regions between said plurality of MISFET structures are connected.

7. The device according to claim 5, wherein at least one of said drain regions has an area smaller than that of at least one of said source regions.

8. The device according to claim 5, wherein a total area of said drain regions is smaller than a total area of said source regions.

9. The device according to claim 8, wherein adjacent source regions between said plurality of MISFET structures are connected, and adjacent drain regions between said plurality of MISFET structures are connected.

10. The device according to claim 1, wherein an outer peripheral shape of said element region in each MISFET structure is rectangular when the number of gate electrodes is four, hexagonal when the number of gate electrode is six, and octagonal when the number of gate electrodes is eight.

* * * * *